United States Patent
Watanabe (10) Patent No.: US 11,464,128 B2
(45) Date of Patent: Oct. 4, 2022

(54) ELECTRONIC DEVICE

(71) Applicant: FANUC CORPORATION, Yamanashi (JP)

(72) Inventor: Hitoshi Watanabe, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 196 days.

(21) Appl. No.: 16/787,093

(22) Filed: Feb. 11, 2020

(65) Prior Publication Data
US 2020/0260607 A1    Aug. 13, 2020

(30) Foreign Application Priority Data

Feb. 13, 2019  (JP) .............................. JP2019-023821

(51) Int. Cl.
 *H05K 7/14*   (2006.01)
 *H05K 5/02*   (2006.01)

(52) U.S. Cl.
 CPC ........... *H05K 7/1418* (2013.01); *H05K 5/023* (2013.01); *H05K 5/0217* (2013.01); *H05K 7/1427* (2013.01)

(58) Field of Classification Search
 CPC .... H05K 7/1418; H05K 5/0217; H05K 5/023; H05K 7/1427; H05K 7/1415; H05K 7/1405; H05K 7/1409
 See application file for complete search history.

(56) References Cited

U.S. PATENT DOCUMENTS

| 4,875,867 A | 10/1989 | Hoo |
| 5,277,615 A * | 1/1994 | Hastings ................. G06F 1/184 |
| 5,685,741 A * | 11/1997 | Dewey ................... H01R 31/06 |
| | | 439/668 |

(Continued)

FOREIGN PATENT DOCUMENTS

| CN | 2678317 Y | 2/2005 |
| CN | 1735324 A | 2/2006 |

(Continued)

OTHER PUBLICATIONS

Wang Chunlin, "Research on digital image encryption algorithm based on chaos theory", May 2014, Dissertion submitted to the Graduate School of Henan University, 63 pages (including English abstract).

(Continued)

*Primary Examiner* — Hung S. Bui
*Assistant Examiner* — Sagar Shrestha
(74) *Attorney, Agent, or Firm* — Robert P. Michal, Esq.; Carter, DeLuca & Farrell LLP (57) ABSTRACT

An electronic device having slots into each of which a circuit board is inserted includes faceplates attached respectively to the circuit boards on the side of an extraction direction. The faceplates each include two handle portions that are disposed respectively at both ends of a main body in the width direction and that extend in the extraction direction. The handle portion of one of two faceplates adjacent in the width direction that is located closer to the other of the faceplates, and the handle portion of the other faceplate that is located closer to the one faceplate, have respective distal ends shifted from each other in a thickness direction.

8 Claims, 10 Drawing Sheets

(56) References Cited

U.S. PATENT DOCUMENTS

| | | | | |
|---|---|---|---|---|
| 6,128,196 | A * | 10/2000 | Hoyle, Jr. | H05K 7/1409 206/454 |
| 6,195,262 | B1 * | 2/2001 | Bodette | G06F 1/18 361/728 |
| 6,198,633 | B1 * | 3/2001 | Lehman | G06F 1/185 361/801 |
| 6,288,911 | B1 * | 9/2001 | Aoki | H05K 7/1409 211/41.17 |
| 6,359,789 | B1 | 3/2002 | Imabayashi et al. | |
| 6,744,633 | B1 | 6/2004 | Dials et al. | |
| 6,879,495 | B2 * | 4/2005 | Jiang | G06F 1/184 361/818 |
| 7,023,704 | B1 | 4/2006 | Zarnowitz et al. | |
| 7,238,893 | B2 * | 7/2007 | Hensley | H05K 7/1409 174/351 |
| 7,453,706 | B2 * | 11/2008 | Clark | H05K 7/1448 361/790 |
| 8,760,875 | B2 * | 6/2014 | Knight | H04Q 1/15 361/731 |
| 9,326,416 | B1 | 4/2016 | Xu et al. | |
| 9,723,745 | B2 * | 8/2017 | Qi | H05K 7/1409 |
| 10,178,807 | B2 * | 1/2019 | Conn | G06F 1/181 |
| 10,264,701 | B1 * | 4/2019 | Norton | H05K 7/1489 |
| 10,277,015 | B2 * | 4/2019 | Choi | H02B 1/36 |
| 10,285,291 | B1 * | 5/2019 | Lam | H05K 7/1489 |
| 10,455,721 | B2 * | 10/2019 | Miura | H05K 5/0217 |
| 10,528,093 | B1 * | 1/2020 | Erie | G06F 1/185 |
| 2004/0031767 | A1 * | 2/2004 | Ice | H05K 7/1418 211/26 |
| 2006/0087801 | A1 * | 4/2006 | Champion | H05K 7/1461 361/679.41 |
| 2007/0081315 | A1 | 4/2007 | Mondor et al. | |
| 2010/0244641 | A1 | 9/2010 | Bergesch et al. | |
| 2012/0120596 | A1 * | 5/2012 | Bechtolsheim | G06F 1/20 361/679.48 |
| 2013/0230998 | A1 | 9/2013 | Pav et al. | |
| 2016/0050795 | A1 | 2/2016 | Conn et al. | |
| 2017/0118861 | A1 | 4/2017 | Miwa | |
| 2017/0290190 | A1 * | 10/2017 | Lindquist | H05K 7/1439 |
| 2018/0168061 | A1 | 6/2018 | Liao | |

FOREIGN PATENT DOCUMENTS

| | | |
|---|---|---|
| CN | 2819288 Y | 6/2006 |
| CN | 103298674 A | 9/2013 |
| CN | 103576608 A | 2/2014 |
| CN | 204272526 U | 4/2015 |
| CN | 205304621 U | 6/2016 |
| CN | 105930610 A | 9/2016 |
| CN | 107564427 A | 1/2018 |
| CN | 208294297 U | 12/2018 |
| JP | H07288154 A | 10/1995 |
| JP | 2011-071396 A | 4/2011 |
| JP | 2016054266 A | 4/2016 |
| JP | 2017139094 A | 8/2017 |
| TW | 461624 U | 10/2001 |

OTHER PUBLICATIONS

Chen Junwei, "Research and implementation of universal automatic test platform for data converter based on FPGA", Jan. 2016; thesis submitted to Xidian University, 100 pages (including English abstract).
Office Action issued by the United States Patent and Trademark Office in relation to U.S. Appl. No. 16/787,082 dated Apr. 27, 2022 (25 pages).

* cited by examiner

ELECTRONIC DEVICE

CROSS-REFERENCE TO RELATED APPLICATION

This application is based upon and claims the benefit of priority from Japanese Patent Application No. 2019-023821 filed on Feb. 13, 2019, the contents of which are incorporated herein by reference.

BACKGROUND OF THE INVENTION

Field of the Invention

The present invention relates to electronic devices, and more particularly to an electronic device having slots and faceplates that cover openings of the slots.

Description of the Related Art

Electronic devices having slots in which circuit boards can be inserted are generally known. As disclosed in Japanese Laid-Open Patent Publication No. 2011-071396, some of such electronic devices have faceplates that cover the openings of the slots when the circuit boards are inserted in the slots.

SUMMARY OF THE INVENTION

The number of slots provided in one electronic device is increasing as multifunctionality of electronic devices advances. Further, for electronic devices having multiple slots, there is a tendency to arrange adjacent two slots at shorter intervals as the electronic devices are downsized. A shorter interval between two slots means a shorter interval between the faceplates that cover the two slots.

Some faceplates are provided with handles (or knobs or the like) for allowing the operator to hold the faceplate when removing it from the electronic device. However, when the operator attempts to hold the handles of a faceplate to remove it, neighboring other handles will interfere if adjacent two faceplates are disposed at a short interval.

Accordingly, an object of the present invention is to provide an electronic device in which a handle portion of one of adjacent two faceplates can be held without being interfered with by a handle portion of the other faceplate.

An aspect of the present invention is directed to an electronic device comprising a casing including at least two slots into each of which a circuit board is inserted along an insertion direction. The at least two slots are formed in the casing so that openings of the slots are positioned adjacent to each other in a width direction of the circuit boards. The electronic device further includes faceplates that are attached respectively to the circuit boards on a side of an extraction direction opposite to the insertion direction, and the faceplates each include a main body configured to cover the opening of the slot when the circuit board is inserted in the slot, and two handle portions that are disposed respectively at both ends of the main body in the width direction and that extend in the extraction direction. The handle portion of one of two of the faceplates adjacent in the width direction that is located closer to another of the faceplates, and the handle portion of the other faceplate that is located closer to the one faceplate, have respective distal ends shifted from each other in a thickness direction of the circuit board.

The present invention provides an electronic device in which a handle portion of one of adjacent two faceplates can be held without being interfered with by a handle portion of the other faceplate.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

The present invention will now be described in detail referring to the accompanying drawings in conjunction with preferred embodiments. Directions will hereinafter be designated according to the arrows in the drawings.

Embodiment

Figure 1:
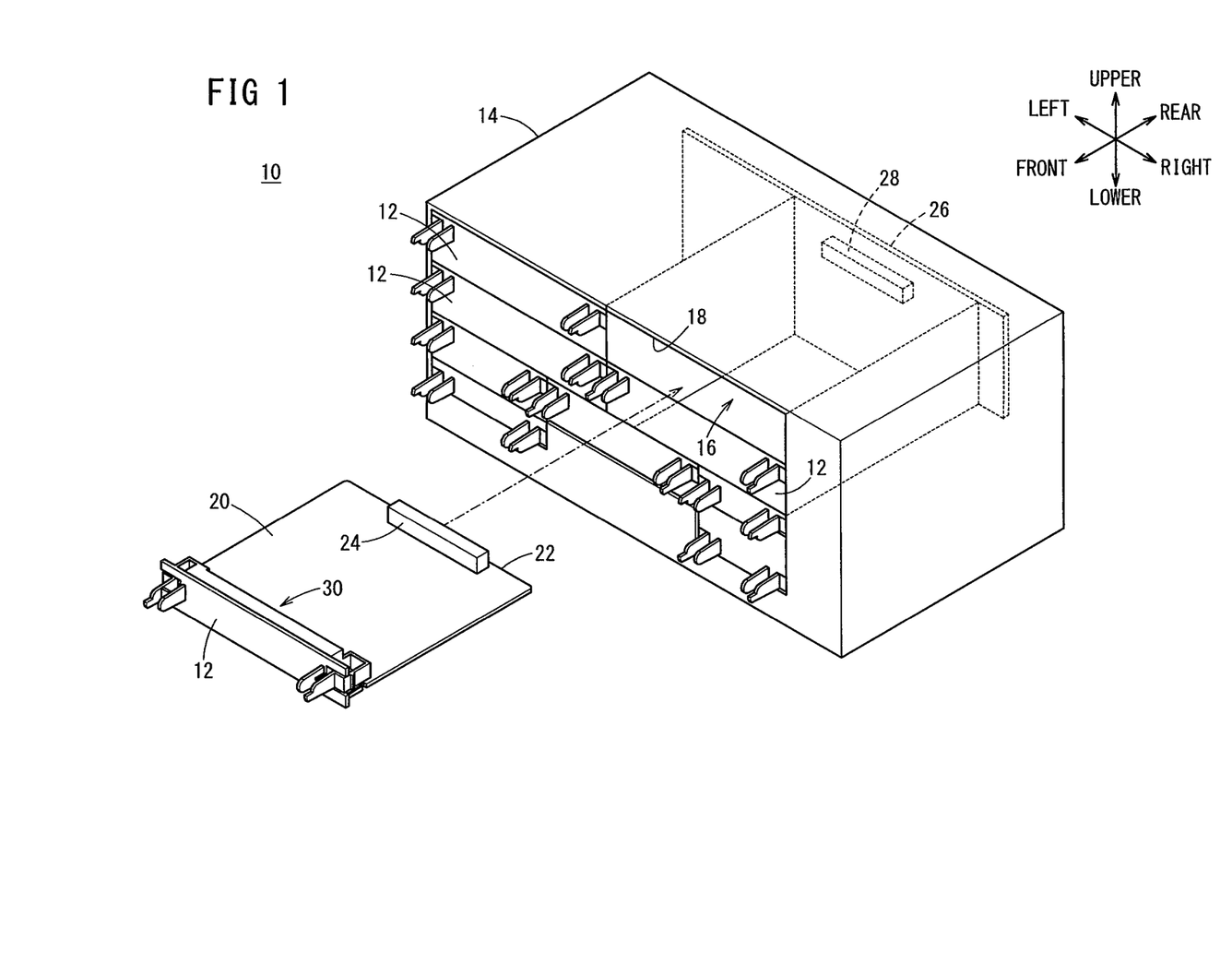
FIG. 1 is a first perspective view illustrating an electronic device according to an embodiment.

FIG. 1 is a first perspective view illustrating an electronic device 10 according to an embodiment.

The electronic device 10 of this embodiment can be a numerical control device having operation functions, for example. The electronic device 10 includes a casing 14, a plurality of slots 16 formed in the casing 14, faceplates 12 that are fitted to the casing 14 to cover openings 18 of the slots 16, and circuit boards 20 to which the faceplates 12 are respectively attached.

As shown in FIG. 1, the plurality of slots 16 are arranged in the casing 14 such that two or more slots 16 are positioned adjacent to each other in the right-left direction. As shown in FIG. 1, in this embodiment, each opening 18 is formed in a rectangular shape as seen from in front of the casing 14.

The circuit board 20 can be inserted into each of the multiple slots 16 through the opening 18 along the rearward direction (insertion direction).

The circuit boards 20 can be printed circuit boards having certain electric circuits formed thereon, for example. Each circuit board 20 has a given width along the right-left direction (width direction) and a given thickness along the upper-lower direction (thickness direction). The circuit board 20 has a first connector 24 formed at its end 22 on the rear side. The first connector 24 is connected to a second connector 28 on a backboard 26 that is disposed at the rear end of the slot 16 inside the casing 14. The circuit board 20 inserted in the slot 16 can also be extracted out of the slot 16 along the frontward direction (extraction direction) opposite to the rearward direction.

The above-mentioned faceplate 12 is attached to an end 30 of the circuit board 20 on the front side. Thus, the faceplate 12 can cover the opening 18 of the slot 16 at almost the same time as the circuit board 20 is connected to the backboard 26.

In this embodiment, two types of faceplates 12 (faceplates 12A and faceplates 12B which will be described below) are attached to the electronic device 10. Note that the faceplates 12A and the faceplates 12B will both be referred to simply as "faceplates 12" hereinafter when it is not especially necessary to distinguish them.

Figure 2A:
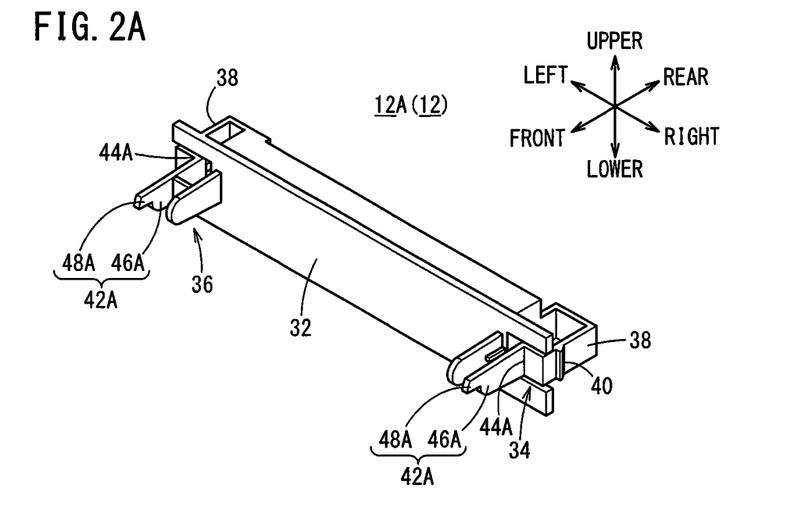
FIG. 2A is a perspective view showing a first type of faceplate of the embodiment.
Figure 2B:
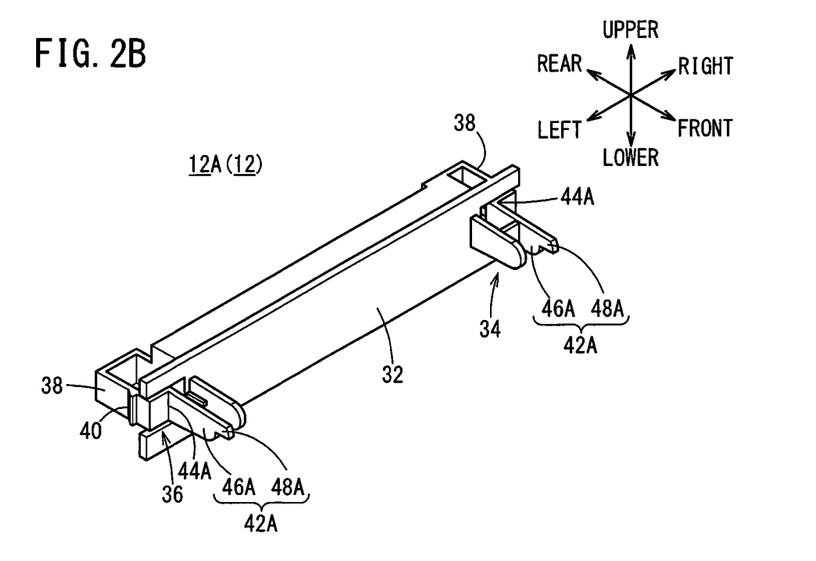
FIG. 2B shows the faceplate of FIG. 2A seen from another direction.

FIG. 2A is a perspective view of the faceplate 12A of a first type according to the embodiment. FIG. 2B shows the faceplate 12A of FIG. 2A seen from another direction.

The faceplate 12A includes a main body 32 that covers the opening 18 of the slot 16 when the circuit board 20 is inserted in the slot 16, and engagement members 38 that are disposed at both ends of the main body 32 in the right-left direction to engage with the slot 16.

As shown in FIGS. 2A and 2B, the main body 32 is a rectangular, plate-like member. It is preferred that the shape of the main body 32 thus corresponds to the shape of the opening 18.

Each engagement member 38 has an engagement portion 40 that engages with the slot 16. The engagement portion 40 of this embodiment is a raised portion that fits in a recessed portion (not shown) formed in the slot 16. The faceplate 12A can keep covering the opening 18 of the slot 16 by engaging with the slot 16. This prevents the circuit board 20 from falling off the slot 16. The engagement members 38 have flexibility such that they can bend in the right-left direction. The engagement portions 40 can then move in the right-left direction.

Each faceplate 12A has two handle portions 42A (handle portions 42) that are respectively disposed at both ends 34, 36 of the main body 32 in the right-left direction to extend in the frontward direction. In this embodiment, the end 34 is a part of the main body 32 that is disposed relatively to the right and the end 36 is a part of the main body 32 that is disposed relatively to the left. Each handle portion 42A includes a flexible support portion 46A (support portion 46) provided on the main body 32 so as to extend from a proximal end 44A (proximal end 44) in a direction parallel to the frontward direction, and a distal end 48A (distal end 48) that is supported by the support portion 46A and directed in the direction parallel to the frontward direction.

The two handle portions 42A of one faceplate 12A have respective proximal ends 44A located at the same position in the upper-lower direction. The two handle portions 42A of one faceplate 12A have respective distal ends 48A located at the same position in the upper-lower direction.

The operator holds the two handle portions 42A of the faceplate 12A when removing the faceplate 12A and the circuit board 20 from the slot 16, for example. In this way, the handle portions 42A function as so-called "handles". Specifically, in a state where the engagement between the faceplate 12A and the slot 16 is released, the operator holds and pulls the handle portions 42A of the faceplate 12A frontward. The operator can thus easily remove the faceplate 12A and the circuit board 20 from the slot 16.

In this embodiment, the handle portions 42A are attached to the engagement members 38 respectively at both ends 34, 36 of the main body 32. In this embodiment, the handle portions 42A have flexibility. Accordingly, the handle portions 42A can move in the right-left direction within the range that its flexibility allows. The engagement members 38 also have flexibility and so can move in the same direction as the handle portions 42A move. Thus, in this embodiment, it is possible to move the engagement members 38 in directions for releasing the engagement between the slot 16 and the engagement members 38 by moving the handle portions 42A in the directions for releasing the engagement.

The "directions for releasing" means such directions that the engagement portions 40 of the engagement members 38 separate away from the slot 16. For example, at the right-side end 34 of the main body 32, the engagement portion 40 separates away from the slot 16 when the engagement member 38 is moved to the left. Accordingly, the "direction for releasing" for the handle portion 42A on the right side is "direction to the left". Similarly, the "direction for releasing" for the handle portion 42A on the left side is "direction to the right".

The operator can move the handle portions 42A and engagement members 38 in the directions for releasing by holding the handle portions 42A. Hence, the operator can easily unlock the engagement between the slot 16 and the engagement portions 40 by holding the handle portions 42A. Furthermore, by pulling the faceplate 12A frontward in this state, the operator can easily remove the faceplate 12A from the slot 16 as mentioned above. In this way, the faceplate 12A of the embodiment allows the operator to easily achieve the work of removing it from the slot 16.

Moreover, in this embodiment, the proximal ends 44A of the two handle portions 42A of the faceplate 12A are located at the same position in the upper-lower direction. This arrangement makes it easy to apply equal forces to the two handle portions 42A when the operator removes the faceplate 12A while holding the two handle portions 42A.

Figure 3A:
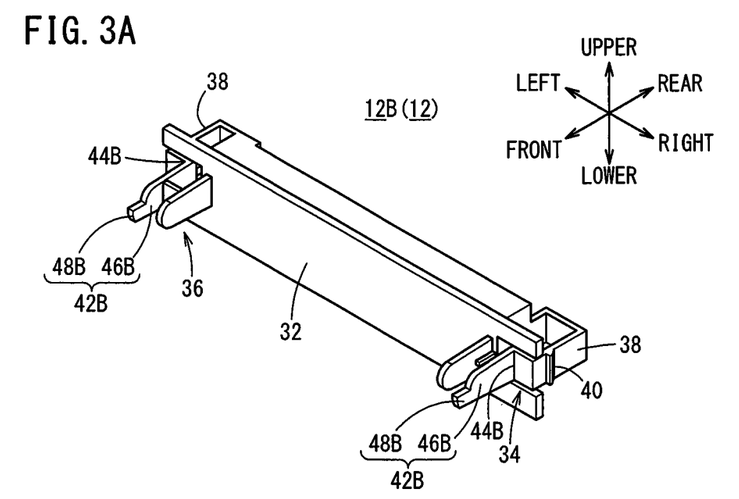
FIG. 3A is a perspective view showing a second type of faceplate of the embodiment.
Figure 3B:
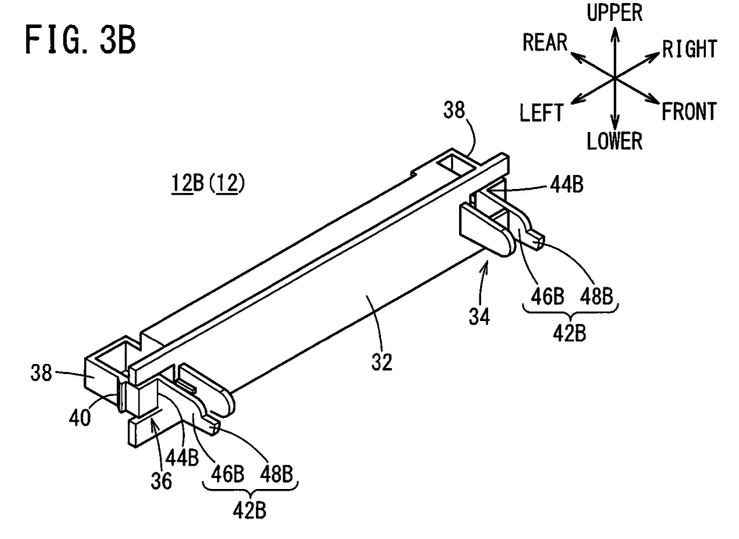
FIG. 3B shows the faceplate of FIG. 3A seen from another direction.

FIG. 3A is a perspective view of the faceplate 12B of a second type according to the embodiment. FIG. 3B shows the faceplate 12B of FIG. 3A seen from another direction.

The faceplate 12B includes a main body 32, engagement members 38, and engagement portions 40 that are similar to those of the faceplate 12A described above. The faceplate 12B further includes handle portions 42B (handle portions 42) respectively at both ends 34, 36 of the main body 32. Each handle portion 42B includes a flexible support portion 46B (support portion 46) that extends in a direction parallel to the frontward direction from its proximal end 44B (proximal end 44), and a distal end 48B (distal end 48) supported by the support portion 46B. The handle portions 42B are attached to the engagement members 38 similarly to the handle portions 42A, allowing the operator to easily release the engagement between the slot 16 and the engagement portions 40 by holding them.

Figure 4A:
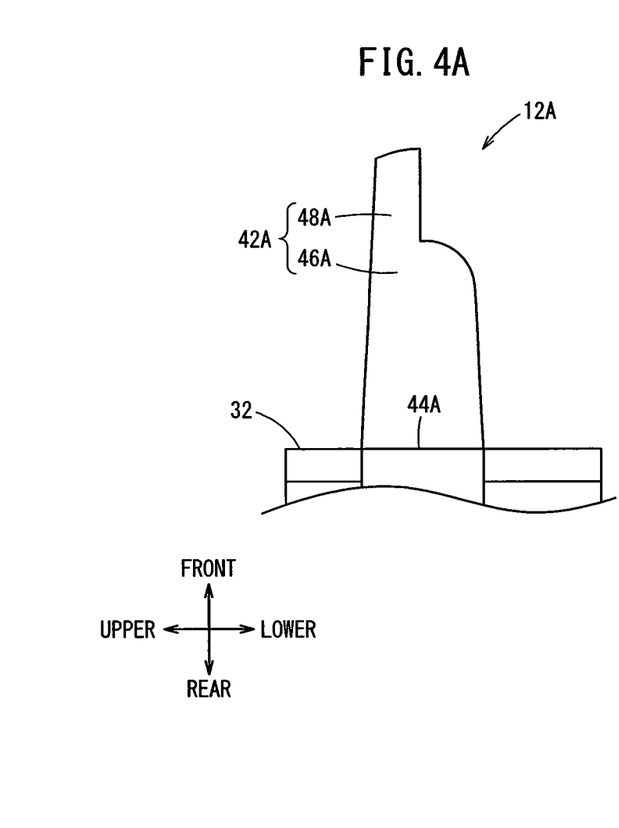
FIG. 4A is a side view of the first type of faceplate of the embodiment.
Figure 4B:
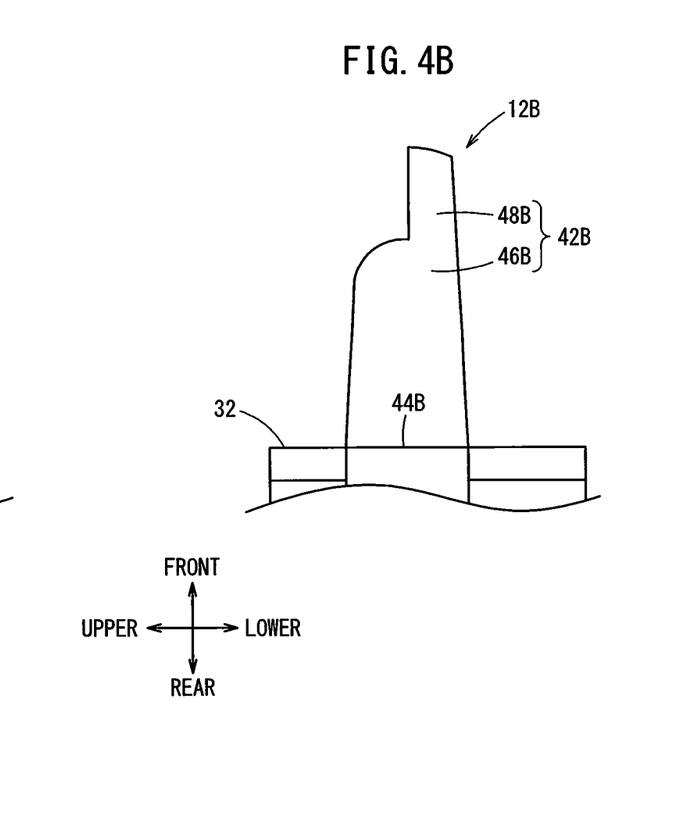
FIG. 4B is a side view of the second type of faceplate of the embodiment.

FIG. 4A is a side view of the faceplate 12A of the embodiment. FIG. 4B is a side view of the faceplate 12B of the embodiment. FIGS. 4A and 4B respectively show parts of the faceplate 12A and faceplate 12B seen from the left.

The distal end 48B is shaped in the same way as the distal end 48A and directed in the direction parallel to the frontward direction in the same way as the distal end 48A. However, as can be seen by comparing FIGS. 4A and 4B, the distal end 48B differs from the distal end 48A in that the position of the distal end 48A of the faceplate 12A and the position of the distal end 48B of the faceplate 12B are shifted from each other in the upper-lower direction. In this embodiment, the distal end 48A is shifted relatively to the upper side and the distal end 48B is shifted relatively to the lower side. The distal end 48A may be shifted relatively downward, with the distal end 48B shifted relatively upward.

Figure 5:
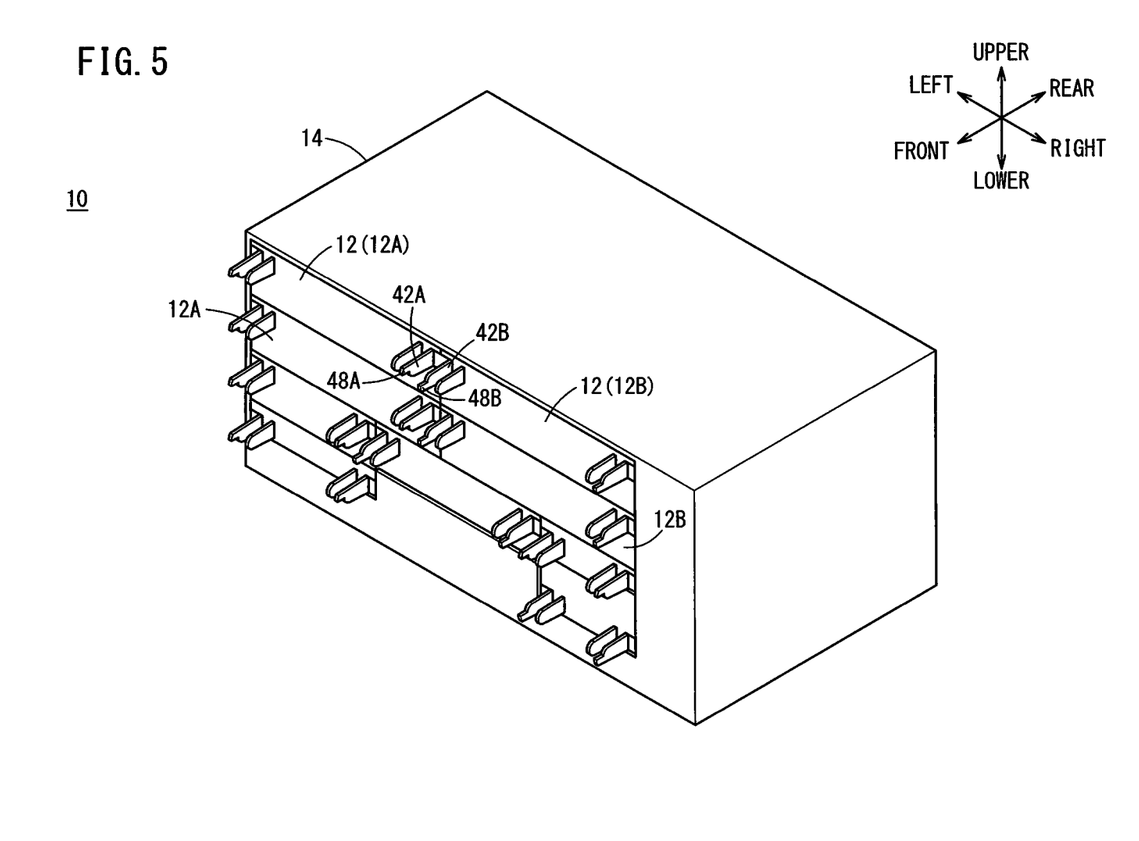
FIG. 5 is a second perspective view of the electronic device of the embodiment.

FIG. 5 is a second perspective view of the electronic device 10 of the embodiment.

FIG. 5 shows an example of the electronic device 10 where the circuit boards 20 fitted with the above-described faceplates 12 are inserted in the slots 16. In this embodiment, the circuit boards 20 fitted with the faceplates 12A and the circuit boards 20 fitted with the faceplates 12B are inserted in the slots 16 so that the faceplate 12A and the faceplate 12B are positioned adjacent to each other in the right-left direction. Thus, in the right-left direction, the handle portion 42A of the faceplate 12A that is located closer to the faceplate 12B is positioned adjacent to the handle portion 42B of that faceplate 12B that is located closer to the faceplate 12A.

Figure 6:
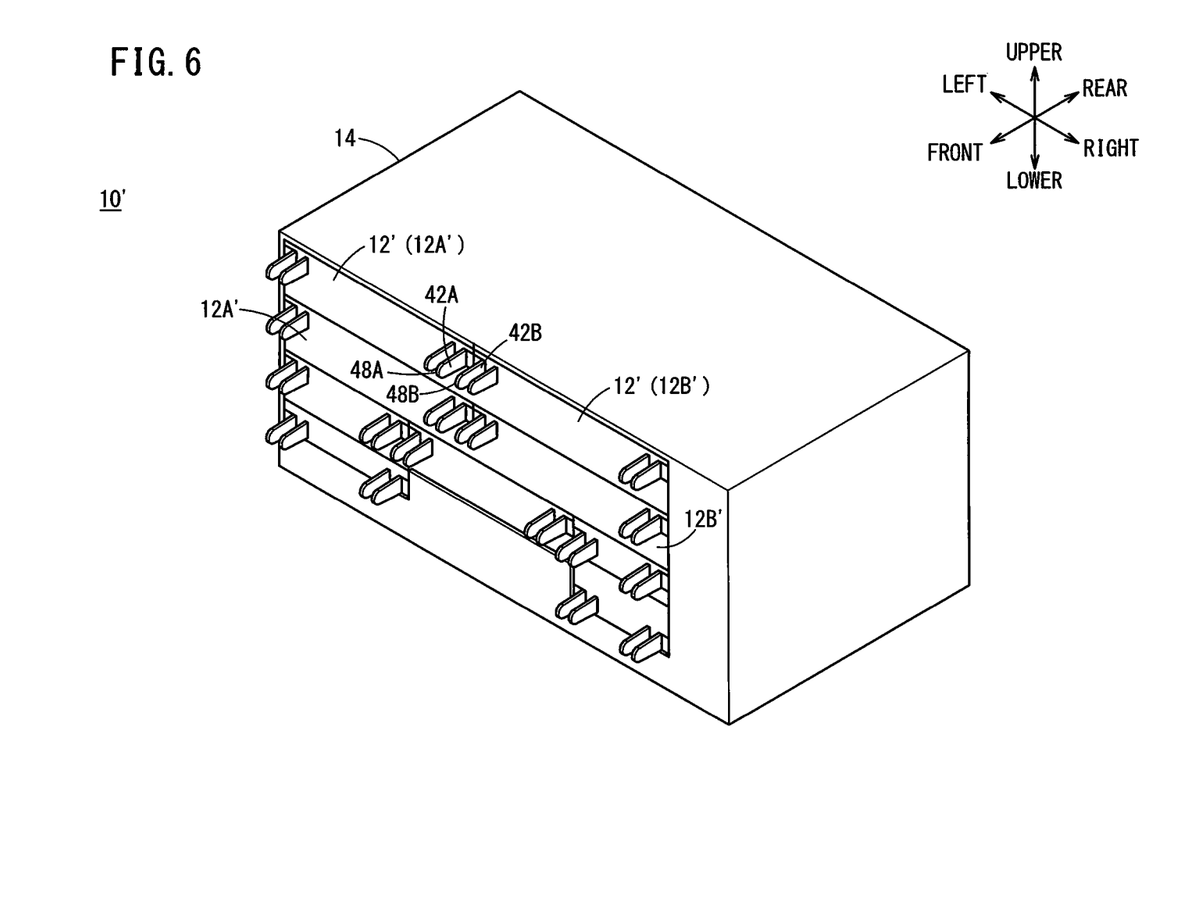
FIG. 6 is a perspective view of an electronic device for reference that is fitted with faceplates.

FIG. 6 is a perspective view of an electronic device 10' for reference that is fitted with faceplates 12'.

Now, as an example for reference to explain a problem of conventional techniques, a description will be given concerning the electronic device 10' fitted with faceplates 12A' and faceplates 12B' having respective distal ends 48A and distal ends 48B located at the same position in the upper-lower direction. Note that the faceplates 12A' and faceplates 12B' have the same configurations as the faceplates 12A and faceplates 12B except that the distal ends 48A and the distal ends 48B are located at the same position in the upper-lower direction. Also, note that the electronic device 10' has the same configuration as the electronic device 10 except that it includes the faceplates 12A' and faceplates 12B'. Accordingly, with the electronic device 10', a handle portion 42A of a faceplate 12A' and a handle portion 42B of a faceplate 12B' are positioned adjacent to each other in the right-left direction.

When removing the faceplate 12A' from the slot 16, the operator can hold and pull the handle portions 42A of the faceplate 12A'. However, if the casing 14 of the electronic device 10' is compact, for example, the right-side handle portion 42A of the faceplate 12A' and the left-side handle portion 42B of the faceplate 12B' may be placed at a very short distance. Even if the casing 14 of the electronic device 10' is not compact, the right-side handle portion 42A of the faceplate 12A' and the left-side handle portion 42B of the faceplate 12B' may be placed at a short distance if the slots 16 are formed densely. In such a case, for example, the left-side handle portion 42B of the faceplate 12B' that is located adjacent to the faceplate 12A' on its right side will interfere when the operator attempts to hold the right-side handle portion 42A of the faceplate 12A'. As a result, the operator cannot easily remove the faceplate 12A' from the electronic device 10'. In this way, the electronic device 10' has the drawback that the work of removing the faceplate 12A' or faceplate 12B' is difficult if the faceplate 12A' and the faceplate 12B' are adjacent to each other.

Returning to FIG. 5, the electronic device 10 of this embodiment includes the two types of faceplates 12 (12A, 12B) that are positioned adjacent to each other in the right-left direction. The two types of faceplates 12 have the handle portions 42 (42A, 42B) whose respective distal ends 48 (48A, 48B) are shifted in the upper-lower direction. Accordingly, when removing the faceplate 12A from the slot 16, the operator can hold the distal ends 48A that are shifted relatively upward from the distal ends 48B, while avoiding the distal end 48B. In this way, with the electronic device 10 of this embodiment, the handle portion 42 of one of adjacent two faceplates 12 is less likely to be interfered with by the handle portion 42 of the other faceplate 12.

Needless to say, the arrangement of the faceplates 12A and the faceplates 12B can be modified from the configuration shown in FIG. 5.

Though not described above, guide rails for guiding the circuit boards 20 in the front-rear direction may be provided in the slots 16 of the casing 14. This enables easy insertion and extraction of the circuit boards 20 into and from the slots 16.

Further, though not described above, the circuit board 20 may be provided with a connecting terminal formed at its end 30 on the front side, for example, in order to make external connection. In this case, an opening for the terminal, for exposing the connecting terminal on the front side, may be provided in a portion of the main body 32 of the faceplate 12 that faces the connecting terminal. It is then possible to electrically connect the connecting terminal and equipment other than the electronic device 10 through this opening of the main body 32, with the circuit board 20 inserted in the slot 16.

[Modifications]

The embodiment has been described as an example of the present invention and the above-described embodiment can of course be modified or improved in various manners. It is clear from recitation of claims that such modified or improved embodiments are also included in the technical scope of the present invention.

(First Modification)

Figure 7A:
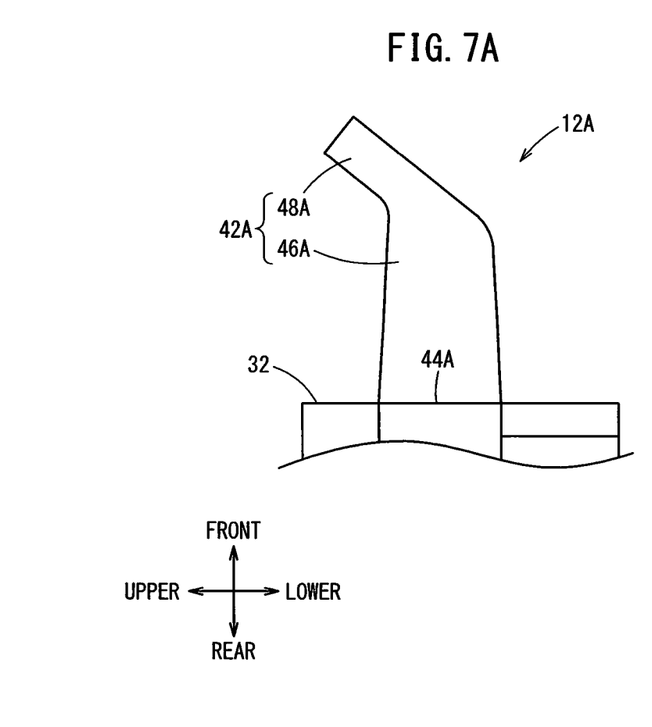
FIG. 7A is a side view of a first type of faceplate according to a first modification.
Figure 7B:
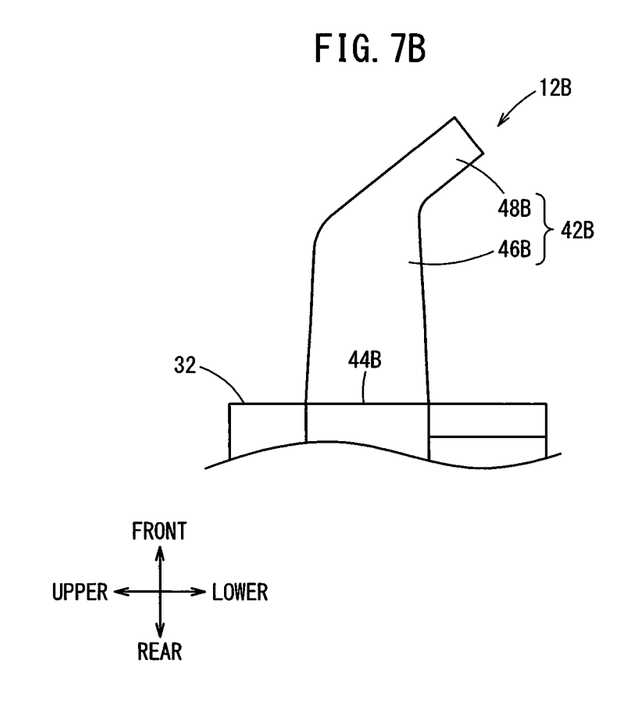
FIG. 7B is a side view of a second type of faceplate of the first modification.

FIG. 7A is a side view of a faceplate 12A according to a first modification. FIG. 7B is a side view of a faceplate 12B of the first modification.

The distal end 48A and the distal end 48B may be modified to be directed in different directions from those of the embodiment. For example, the distal end 48A of the faceplate 12A that is located closer to the faceplate 12B may be directed frontward obliquely toward one side in the upper-lower direction, and the distal end 48B of the faceplate 12B that is located closer to the faceplate 12A may be directed frontward obliquely toward the other side in the upper-lower direction. For instance, FIG. 7A shows an example in which the distal end 48A is directed frontward obliquely toward the upper side. Also, FIG. 7B shows an example in which the distal end 48B is directed frontward obliquely toward the lower side. The distal end 48A may be directed frontward obliquely toward the lower side, with the distal end 48B directed frontward obliquely toward the upper side.

The operator fits the faceplates 12A and the faceplates 12B to the slots 16 of the electronic device 10 alternately in the right-left direction. This further reduces the likelihood that the handle portion 42 of one faceplate 12 in the right-left direction interferes when the operator holds the distal end 48 of the other faceplate 12.

Figure 8A:
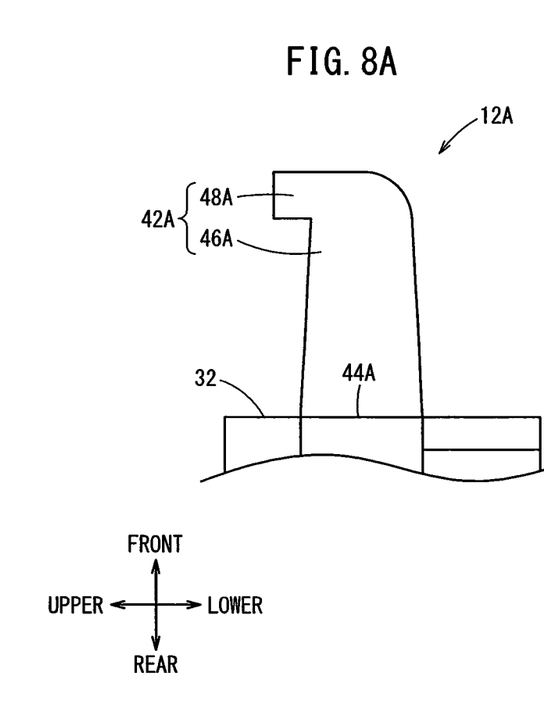
FIG. 8A is a side view of a first type of faceplate according to another example of the first modification.
Figure 8B:
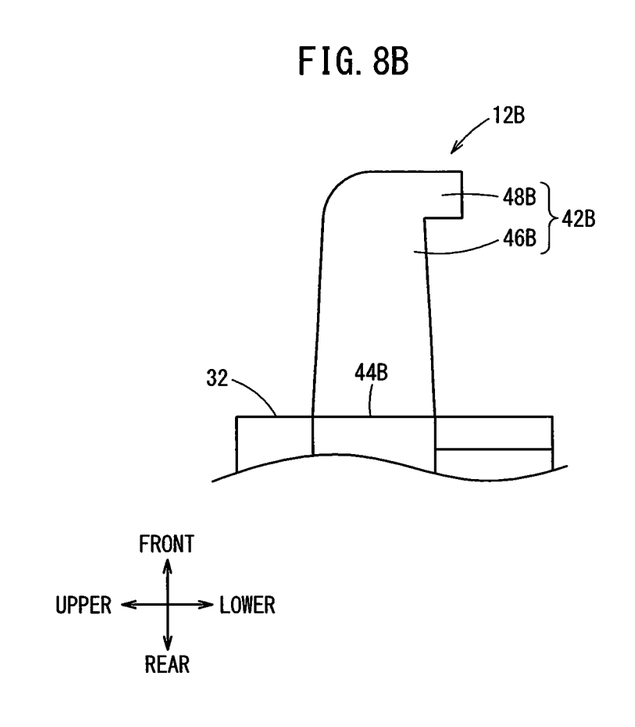
FIG. 8B is a side view of a second type of faceplate of that another example of the first modification.

FIG. 8A is a side view of another faceplate 12A of the first modification. FIG. 8B is a side view of another faceplate 12B of the first modification.

In this modification, the distal end 48A of the faceplate 12A that is located closer to the faceplate 12B may be directed to one side in parallel with the upper-lower direction, with the distal end 48B of the faceplate 12B that is located closer to the faceplate 12A directed to the other side in parallel with the upper-lower direction. For instance, FIG. 8A shows an example in which the distal end 48A is directed to the upper side in parallel with the upper-lower direction. Also, FIG. 8B shows an example in which the distal end 48B is directed to the lower side in parallel with the upper-lower direction. The distal end 48A may be directed to the lower side in parallel with the upper-lower direction, with the distal end 48B directed to the upper side in parallel with the upper-lower direction.

The operator fits the faceplates 12A and the faceplates 12B to the slots 16 of the electronic device 10 alternately in the right-left direction. This further reduces the likelihood that the handle portion 42 of one faceplate 12 in the right-left direction interferes when the operator holds the distal end 48 of the other faceplate 12.

(Second Modification)

Figure 9A:
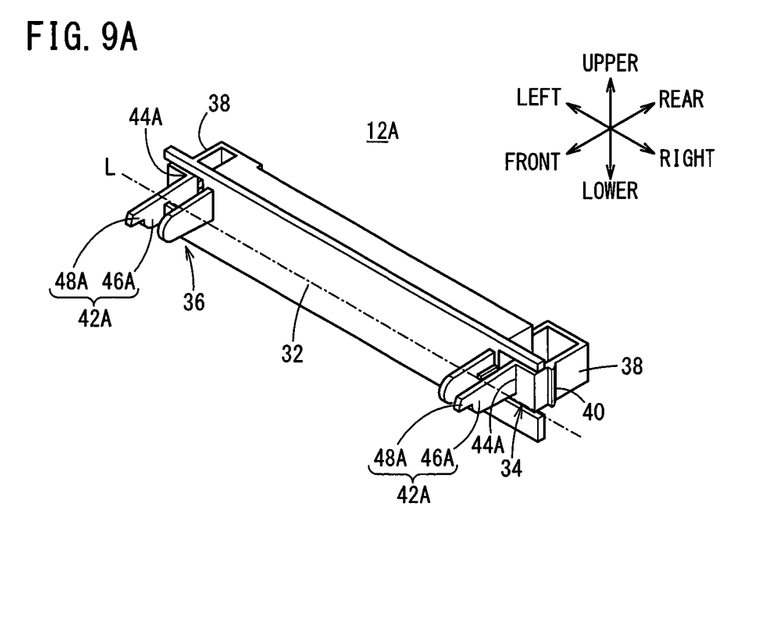
FIG. 9A is a perspective view of a first type of faceplate according to a second modification.
Figure 9B:
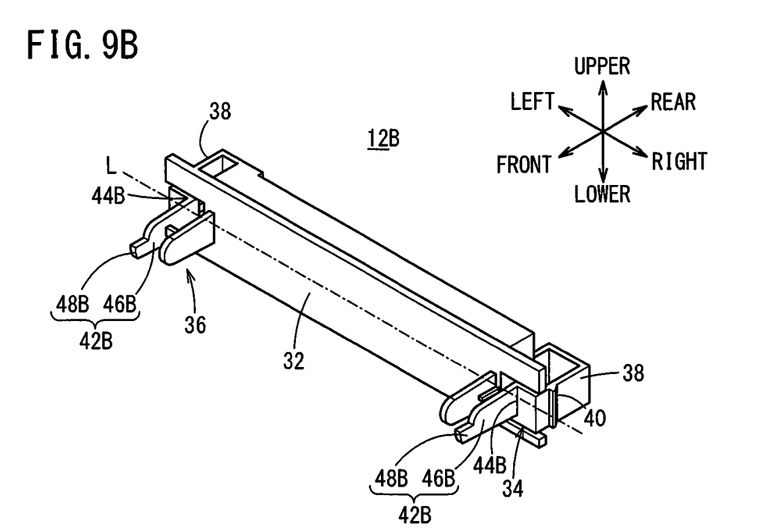
FIG. 9B is a perspective view of a second type of faceplate of the second modification.

FIG. 9A is a perspective view of a faceplate 12A according to a second modification. FIG. 9B is a perspective view of a faceplate 12B of the second modification.

In the embodiment above, the proximal ends 44A of the handle portions 42A and the proximal ends 44B of the handle portions 42B are located at the same position in the upper-lower direction. The proximal end 44A of the faceplate 12A that is located closer to the faceplate 12B and the proximal end 44B of the faceplate 12B that is located closer to the faceplate 12A may be located at positions shifted from each other in the upper-lower direction. FIG. 9A shows an example in which the proximal ends 44A are shifted relatively upward from the proximal ends 44B. FIG. 9B shows an example in which the proximal ends 44B are shifted relatively downward from the proximal ends 44A. The center lines L in FIGS. 9A and 9B are each an imaginary line passing through the middle of the main body 32 in the upper-lower direction. The proximal ends 44A may be shifted relatively downward from the proximal ends 44B and the proximal ends 44B may be shifted relatively upward from the proximal ends 44A.

The operator fits the faceplates 12A and the faceplates 12B to the slots 16 of the electronic device 10 alternately in the right-left direction. This further reduces the likelihood that the handle portion 42 of one faceplate 12 in the right-left direction interferes when the operator holds the distal end 48 of the other faceplate 12.

(Third Modification)

Figure 10A:
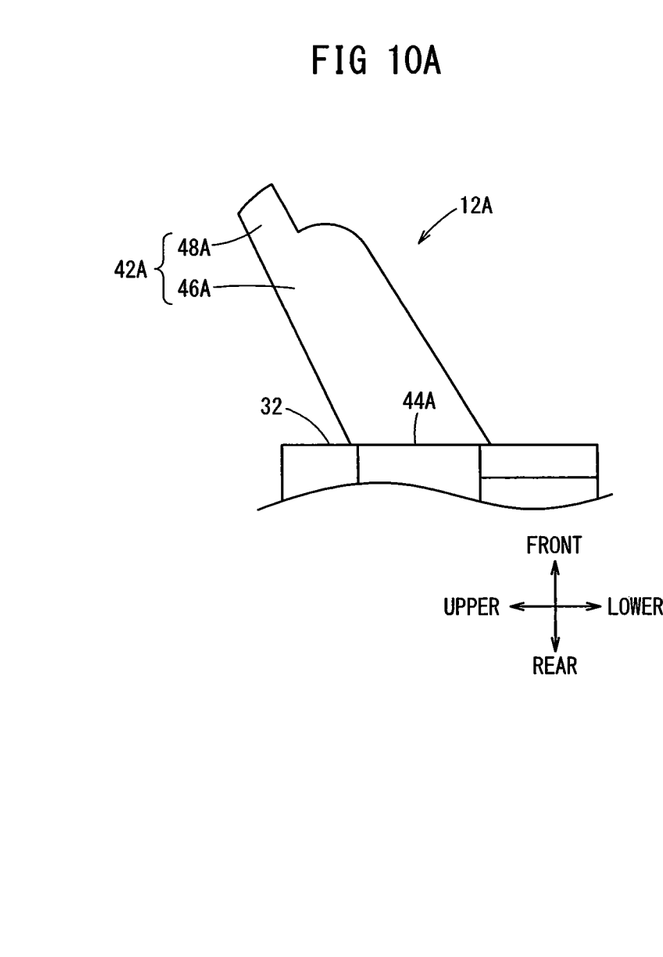
FIG. 10A is a side view of a faceplate according to a third modification.
Figure 10B:
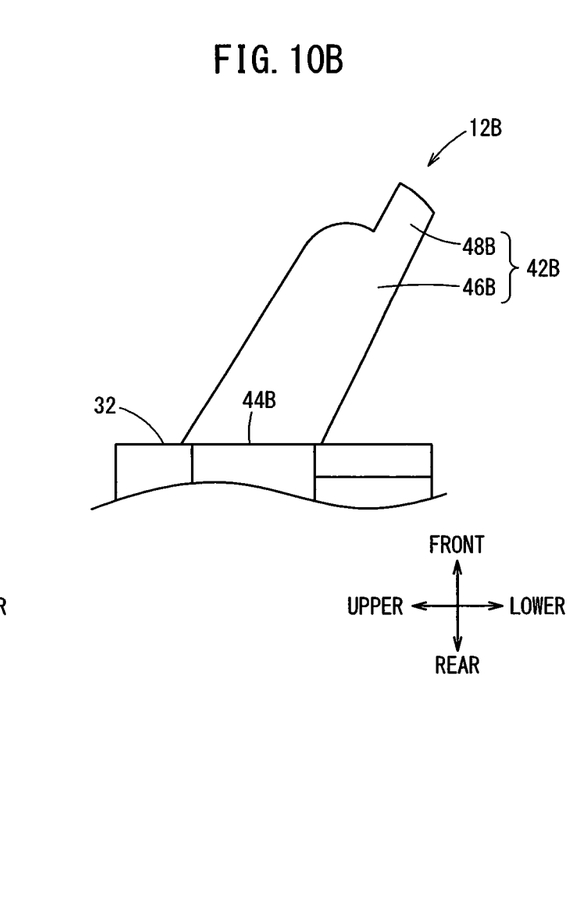
FIG. 10B is a side view of a faceplate of the third modification.

FIG. 10A is a side view of a faceplate 12A according to a third modification. FIG. 10B is a side view of a faceplate 12B of the third modification.

The embodiment above has illustrated an application where the support portions 46A of the handle portions 42A and the support portions 46B of the handle portions 42B are both members that extend in a direction parallel to the frontward direction. The support portion 46A of the faceplate 12A that is located closer to the faceplate 12B may be directed frontward from the proximal end 44A to extend obliquely toward one side in the upper-lower direction. In this case, the support portion 46B of the faceplate 12B that is located closer to the faceplate 12A may be directed frontward from the proximal end 44B to extend obliquely toward the other side in the upper-lower direction.

FIG. 10A shows a support portion 46A extending frontward obliquely toward the upper side from the proximal end 44A. FIG. 10B shows a support portion 46B extending frontward obliquely toward the lower side from the proximal end 44B. The support portion 46A may extend frontward obliquely toward the lower side from the proximal end 44A and the support portion 46B may extend frontward obliquely toward the upper side from the proximal end 44B.

In applications of this modification, the directions of the distal ends 48 can also be appropriately changed. In FIG. 10A, the distal end 48A is directed in the same direction as the support portion 46A, i.e., directed frontward obliquely toward the upper side. In FIG. 10B, the distal end 48B is directed in the same direction as the support portion 46B, i.e., directed frontward obliquely toward the lower side. This configuration may be changed for example so that, as in the embodiment above, the distal end 48A and the distal end 48B are directed in a direction parallel to the frontward direction. Alternatively, for example, as in the second example of the first modification, the distal end 48A and the distal end 48B may be formed so that the distal end 48A is directed upward in parallel with the upper-lower diction and the distal end 48B is directed downward in parallel with the upper-lower direction.

The operator fits the faceplates 12A and the faceplates 12B to the slots 16 of the electronic device 10 alternately in the right-left direction. This further reduces the likelihood that the handle portion 42 of one faceplate 12 in the right-left direction interferes when the operator holds the distal end 48 of the other faceplate 12.

(Fourth Modification)

The embodiments and modifications described above can be appropriately combined together without incurring contradictions.

Invention Obtained from Embodiments

The invention obtainable from the embodiments and modifications above will be recited below.

An electronic device (10) is provided which includes a casing (14) including at least two slots (16) into each of which a circuit board (20) is inserted along an insertion direction, wherein the at least two slots (16) are formed in the casing (14) so that openings (18) of the slots (16) are positioned adjacent to each other in a width direction of the circuit boards (20). The electronic device (10) further includes faceplates (12) that are attached respectively to the circuit boards (20) on the side of an extraction direction opposite to the insertion direction. The faceplates (12) each include a main body (32) configured to cover the opening (18) of the slot (16) when the circuit board (20) is inserted in the slot (16), and two handle portions (42) that are disposed respectively at both ends (34, 36) of the main body (32) in the width direction and that extend in the extraction direction. The handle portion (42) of one of two of the faceplates (12) adjacent in the width direction that is located closer to the other of the faceplates (12), and the handle portion (42) of the other faceplate (12) that is located closer to the one faceplate (12), have respective distal ends (48) shifted from each other in a thickness direction of the circuit board.

Thus, an electronic device (10) is provided, with which the handle portion (42) of one of adjacent two faceplates (12) can be held without being interfered with by the handle portion (42) of the other faceplate (12).

The distal end (48) of the handle portion (42) of the one faceplate (12) that is located closer to the other faceplate (12), and the distal end (48) of the handle portion (42) of the other faceplate (12) that is located closer to the one faceplate (12), may be directed in a direction parallel to the extraction direction. This allows the operator to hold the distal end (48) of the handle portion (42) of one of two faceplates (12) adjacent in the width direction (right-left direction), while easily avoiding the handle portion (42) of the other faceplate (12).

The distal end (48) of the handle portion (42) of the one faceplate (12) that is located closer to the other faceplate (12) may be directed in the extraction direction obliquely toward one side in the thickness direction, and the distal end (48) of the handle portion (42) of the other faceplate (12) that is located closer to the one faceplate (12) may be directed in the extraction direction obliquely toward the other side in the thickness direction. Then, even when two faceplates (12) are located adjacent to each other in the width direction, it is easier to hold the distal end (48) of the handle portion (42) of one of the two faceplates (12).

The distal end (48) of the handle portion (42) of the one faceplate (12) that is located closer to the other faceplate (12) may be directed to one side in the thickness direction in parallel with the thickness direction, and the distal end (48) of the handle portion (42) of the other faceplate (12) that is located closer to the one faceplate (12) may be directed to the other side in the thickness direction in parallel with the thickness direction. Then, even when two faceplates (12) are located adjacent to each other in the width direction, it is easier to hold the distal end (48) of the handle portion (42) of one of the two faceplates (12).

The handle portion (42) of the one faceplate (12) that is located closer to the other faceplate (12), and the handle portion (42) of the other faceplate (12) that is located closer to the one faceplate (12), may have respective proximal ends (44) located at a same position in a direction that intersects the extraction direction. This allows the operator to easily apply equal forces to the two handle portions (42) of one faceplate (12).

The handle portion (42) of the one faceplate (12) that is located closer to the other faceplate (12) may extend in the extraction direction obliquely toward one side in the thickness direction, and the handle portion (42) of the other faceplate (12) that is located closer to the one faceplate (12) may extend in the extraction direction obliquely toward the other side in the thickness direction. Then, even when two faceplates (12) are located adjacent to each other in the width direction, it is easier to hold the handle portion (42) of one of the two faceplates (12).

Each of the faceplates may further include engagement members (38) that engage with the slot (16) at both ends of the main body (32), the handle portions (42) may be attached respectively to the engagement members (38), and the handle portions (42) may be configured to release the engagement between the slot (16) and the engagement members (38) when the handle portions (42) move in directions for releasing the engagement between the slot (16) and the engagement members (38). This allows the operator to easily remove the faceplate (12) from the slot (16).

The distal ends (48) of the two handle portions (42) of each of two of the faceplates (12) adjacent in the width direction may be located at a same position in the thickness direction. Then, the electronic device (10) only needs two types of faceplates (12).

What is claimed is:

1. An electronic device comprising a casing including at least two slots into each of which a circuit board is inserted along an insertion direction,
   wherein the at least two slots are formed in the casing so that openings of the slots are positioned adjacent to each other in a width direction of the circuit boards,
   the electronic device further comprises faceplates that are attached respectively to the circuit boards on a side of an extraction direction opposite to the insertion direction,
   the faceplates each include
   a main body configured to cover the opening of the slot when the circuit board is inserted in the slot, and
   two handle portions that are disposed respectively at both ends of the main body in the width direction and that extend in the extraction direction, and
   the handle portion of one of two of the faceplates adjacent in the width direction that is located closer to another of the faceplates, and the handle portion of the other faceplate that is located closer to the one faceplate, have respective distal ends shifted from each other in a thickness direction of the circuit board, wherein the thickness direction is perpendicular to the width direction and the extraction direction.

2. The electronic device according to claim 1, wherein the distal end of the handle portion of the one faceplate that is located closer to the other faceplate, and the distal end of the handle portion of the other faceplate that is located closer to the one faceplate, are directed in a direction parallel to the extraction direction.

3. The electronic device according to claim 1, wherein
   the distal end of the handle portion of the one faceplate that is located closer to the other faceplate is directed in the extraction direction obliquely toward one side in the thickness direction, and
   the distal end of the handle portion of the other faceplate that is located closer to the one faceplate is directed in the extraction direction obliquely toward another side in the thickness direction.

4. The electronic device according to claim 1, wherein
   the distal end of the handle portion of the one faceplate that is located closer to the other faceplate is directed to one side in the thickness direction in parallel with the thickness direction, and
   the distal end of the handle portion of the other faceplate that is located closer to the one faceplate is directed to another side in the thickness direction in parallel with the thickness direction.

5. The electronic device according to claim 1, wherein the handle portion of the one faceplate that is located closer to the other faceplate, and the handle portion of the other faceplate that is located closer to the one faceplate, have respective proximal ends located at a same position in a direction that intersects the extraction direction.

6. The electronic device according to claim 1, wherein
   the handle portion of the one faceplate that is located closer to the other faceplate extends in the extraction direction obliquely toward one side in the thickness direction, and
   the handle portion of the other faceplate that is located closer to the one faceplate extends in the extraction direction obliquely toward another side in the thickness direction.

7. The electronic device according to claim 1, wherein
each of the faceplates further includes engagement members that engage with the slot at both ends of the main body,
the handle portions are attached respectively to the engagement members, and
the handle portions are configured to release the engagement between the slot and the engagement members when the handle portions move in directions for releasing the engagement between the slot and the engagement members.

8. The electronic device according to claim 1, wherein the distal ends of the two handle portions of each of two of the faceplates adjacent in the width direction are located at a same position in the thickness direction.

\* \* \* \* \*